(12) United States Patent
Dai

(10) Patent No.: US 9,898,987 B2
(45) Date of Patent: Feb. 20, 2018

(54) GATE DRIVING CIRCUIT

(71) Applicant: Shenzhen China Star Optoelectronics Technology Co., Ltd., Shenzhen, Guangdong (CN)

(72) Inventor: Chao Dai, Guangdong (CN)

(73) Assignee: Shenzhen China Star Optoelectronics Technology Co., Ltd., Shenzhen, Guangdong (CN)

(*) Notice: Subject to any disclaimer, the term of this patent is extended or adjusted under 35 U.S.C. 154(b) by 318 days.

(21) Appl. No.: 14/891,422

(22) PCT Filed: Sep. 29, 2015

(86) PCT No.: PCT/CN2015/091047
§ 371 (c)(1),
(2) Date: Nov. 16, 2015

(87) PCT Pub. No.: WO2017/049658
PCT Pub. Date: Mar. 30, 2017

(65) Prior Publication Data
US 2017/0256218 A1 Sep. 7, 2017

(30) Foreign Application Priority Data

Sep. 24, 2015 (CN) .......................... 2015 1 0617896

(51) Int. Cl.
G09G 3/36 (2006.01)

(52) U.S. Cl.
CPC ... *G09G 3/3677* (2013.01); *G09G 2300/0809* (2013.01); *G09G 2310/08* (2013.01)

(58) Field of Classification Search
CPC ......... G09G 3/3677; G09G 2300/0809; G09G 2310/08
See application file for complete search history.

(56) References Cited

U.S. PATENT DOCUMENTS

| 2016/0086532 A1* | 3/2016 | Keum | G09G 3/3225 345/213 |
| 2016/0086557 A1* | 3/2016 | Watanabe | G09G 3/3648 345/691 |
| 2016/0086559 A1* | 3/2016 | Sone | G09G 3/3611 345/213 |
| 2016/0086560 A1* | 3/2016 | Miyake | G09G 3/3677 345/100 |

* cited by examiner

Primary Examiner — Sejoon Ahn
(74) Attorney, Agent, or Firm — Andrew C. Cheng

(57) ABSTRACT

A gate driving circuit is provided, where includes a plurality of gate driving units connected in cascade, each of the gate driving units is used to drive two scan lines arranged continuously, a gate driving signal of a first scan line and a first cascading signal are respectively transmitted by a first pull up module and a first down transmitting module, and a gate driving signal of a second scan line and a second cascading signal are respectively transmitted by a second pull up module and a second down transmitting module. By the above manner, the disclosure is capable of decreasing a component quantity of GOA circuit, thus achieving the ultra-narrow frame design.

4 Claims, 5 Drawing Sheets

GATE DRIVING CIRCUIT

BACKGROUND

Technical Field

The disclosure is related to liquid crystal technology field, and more particular to a gate driving circuit.

Related Art

The gate driver on array (GOA) manufactures the gate raw scan driving signal circuit on the array substrate by using existing thin film transistor liquid crystal display array substrate process, so as to realize the driving manner for scanning the gate progressively. It has the advantage of reducing the production cost and narrow frame design for a variety of displays.

The GOA circuit includes a pull up portion, a pull up controlling circuit, a down transmitting portion, a bootstrap capacitor and a pull down holding module. Particularly, the pull portion mainly outputs the inputted clock signal to the gate of the thin film transistor, which is served as the driving signal of the liquid crystal display. The pull up controlling circuit controls the activation of the GOA, which is the operation of the signal transmitted by the former stage GOA circuit. The down transmitting portion outputs the cascading signal when the scan signal is outputted; the pull down circuit portion holds the scan signal and the signal of the pull up circuit (usually refers to Q point) at the off state (i.e. the set negative level). The pull down holding module Q pulls up the potential of Q point twice, so as to make ensure the normal output of G(N) of the pull up circuit.

In the GOA circuit of the existing technique, each stage GOA circuit includes the same module, such that each stage GOA circuit includes a larger number of thin film transistor (TFT) elements, which may increase the layout space of the GOA circuit,\. In particular the low temperature poly silicon (LTPS) process has the advantages of the high electron mobility and the mature technology, it is widely used in the small and medium displays. The frame of the display is designed to be as narrow as possible, and ultra-narrow frame design can effectively increase the screen-to-body ratio of the mobile phone.

SUMMARY

An embodiment of the present disclosure provides a gate driving circuit, thereby being capable of decreasing the amount of the components of GOA circuit, thus achieving the ultra-narrow frame design.

The present disclosure provides a gate driving circuit, which includes a plurality of gate driving units connected in cascade, each of the gate driving units is used to drive two scan lines arranged continuously, and the gate driving circuit includes: a pull up controlling module for generating a scan level signal according to a former stage cascading signal; a first pull up module for pulling up a gate driving signal of a first scan line in the two scan lines according to the scan level signal and a first clock signal; a second pull up module for pulling a gate driving signal of a second scan line in the two scan lines according to the scan level signal and a second clock signal; a first down transmitting module for generating a first cascading signal according to the scan level signal; a second down transmitting module for generating a second cascading signal according to the scan level signal; a pull down module for pulling down gate driving signals of the first scan line and the second scan line; a first bootstrap capacitor for generating a low level of the gate driving signal of the first scan line; a second bootstrap capacitor for generating a low level of the gate driving signal of the second scan line; and a pull down holding module for holding the low level of the gate driving signals of the first scan line and the second scan line.

In one embodiment, the pull up controlling module comprises a first switch transistor having a gate for inputting the former stage cascading signal, a source for connecting to a first reference level, and a drain for connecting to the first pull up module, the second pull up module, the first down transmitting module, the second down transmitting module, the first bootstrap capacitor, the second bootstrap capacitor and the pull down holding module.

In one embodiment, the first pull up module comprises a second switch transistor having a gate for connecting to the drain of the first switch transistor, a drain for inputting the first clock signal, and a source for outputting the gate driving signal of the first scan line; and the first down transmitting module comprises a third switch transistor having a gate for connecting to the drain of the first switch transistor, a drain for inputting the first clock signal, and a source for outputting a first cascading signal.

In one embodiment, the second pull up module comprises a fourth switch transistor having a gate for connecting to the drain of the first switch transistor, a drain for inputting the second clock signal, a source for outputting the gate driving signal of the second scan line.

In one embodiment, the second down transmitting module comprises a fifth switch transistor having a gate for connecting to the drain of the first switch transistor, a drain for inputting the second clock signal, and a source for outputting a second cascading signal.

In one embodiment, the pull down module comprises a sixth switch transistor and a seventh switch transistor, wherein a gate of the sixth switch transistor inputs a next stage cascading signal or a next stage gate driving signal, a drain of the sixth switch transistor is connected to the first switch transistor, a source of the sixth switch transistor is connected to a drain of the seventh switch transistor; a gate of the seventh switch transistor inputs a third clock signal, and a source of the seventh switch transistor is connected to the gate driving signal of the first scan line.

In one embodiment, the pull down holding module comprises an inverter, an eighth switch transistor, a ninth switch transistor, a tenth switch transistor, a eleventh switch transistor and a twelfth switch transistor: an input terminal of the inverter is connected to the drain of the first switch transistor, an output terminal of the inverter is connected to a gate of the eighth switch transistor, a gate of the ninth switch transistor, a gate of the tenth switch transistor and a gate of the eleventh switch transistor, a drain of the eighth switch transistor is connected to the drain of the first switch transistor, a source of the eighth switch transistor is connected to a source of the eleventh switch transistor, a drain of the ninth switch transistor inputs a second reference level, a source of the ninth switch transistor is connected to the gate driving signal of the first scan line, a drain of the tenth switch transistor inputs the second reference level, a source of the tenth switch transistor is connected to the gate driving signal of the second scan line, a drain of the eleventh switch transistor inputs a third reference level, a source of the eleventh switch transistor is connected to a drain of the twelfth switch transistor, a gate of the twelfth switch transistor is connected to the drain of the first switch transistor, and a source of the twelfth switch transistor inputs the first reference level.

In one embodiment, the inverter comprises a major inverting module and an auxiliary inverting module, the major inverting module comprises: a thirteenth switch transistor, a fourteenth switch transistor, a fifteenth switch transistor and a sixteenth switch transistor, and the auxiliary inverting module comprises a seventeenth switch transistor and an eighteenth switch transistor, a gate of the thirteenth switch transistor is connected to the drain of the first switch transistor, a drain of the thirteenth switch transistor inputs the second reference level, a source of the thirteenth switch transistor is connected to a drain of the fourteenth switch transistor, a gate and a source of the fourteenth switch transistor input the first reference level; a gate of the fifteenth switch transistor is connected to the drain of the first switch transistor, a drain of the fifteenth switch transistor is connected to a source of the seventeenth switch transistor, a source of the fifteenth switch transistor is the output terminal of the inverter and is connected to a drain of the sixteenth switch transistor; a gate of the sixteenth switch transistor is connected to the source of the thirteenth switch transistor, a source of the sixteenth switch transistor inputs the first reference level; a gate of the seventeenth switch transistor is connected to the drain of the first switch transistor, a drain of the seventeenth switch transistor inputs the third reference level, a gate of the eighteenth switch transistor is connected to the gate of the sixteenth switch transistor, a source of the eighteenth switch transistor inputs the first reference level, a drain of the eighteenth switch transistor is connected to the source of the seventeenth switch transistor.

In one embodiment, the gate driving units connected in three successive stages share the inverter.

In one embodiment, the inverter comprises three major inverting modules and one auxiliary inverting module, a first major inverting module comprises: a nineteenth switch transistor, a twentieth switch transistor, a twenty-first switch transistor and a twenty-second switch transistor, the auxiliary inverting module comprises a twenty-third switch transistor, a twenty-fourth switch transistor, a twenty-fifth switch transistor and a twenty-sixth switch transistor; a second major inverting module comprises: a twenty-seventh switch transistor, a twenty-eighth switch transistor, a twenty-ninth switch transistor and a thirtieth switch transistor; a third major inverting module comprises: a thirty-first switch transistor, a thirty-second switch transistor, a thirty-third switch transistor and a thirty-fourth switch transistor; a gate of the nineteenth switch transistor is connected to an output terminal of the pull up controlling module in a first stage gate driving unit, a drain of the nineteenth switch transistor inputs the second reference level, a source of the nineteenth switch transistor is connected to a drain of the twentieth switch transistor, a gate and a source of the twentieth switch transistor input the first reference level; a gate of the twenty-first switch transistor is connected to the output terminal of the pull up controlling module, a drain of the twenty-first switch transistor is connected to a source of the twenty-fifth switch transistor, a source of the twenty-first switch transistor is the first output terminal of the inverter and is connected to the gate of the eighth switch transistor in the first stage gate driving unit, a gate of the twenty-second switch transistor is connected to the source of the nineteenth switch transistor, a source of the twenty-second switch transistor inputs the first reference level, a drain of the twenty-second switch transistor is connected to the source of the twenty-first switch transistor; a gate of the twenty-third switch transistor is connected to the output terminal of the pull up controlling module, a drain of the twenty-third switch transistor inputs the third reference level, a source of the twenty-third switch transistor is connected to the source of the twenty-fifth switch transistor; a gate of the twenty-fourth switch transistor is connected to the gate of the twenty-second switch transistor, a drain of the twenty-fourth switch transistor is connected to the source of the twenty-fifth switch transistor, a source of the twenty-fourth switch transistor is connected to a drain of the twenty-sixth switch transistor; a gate of the twenty-fifth switch transistor is connected to an output terminal of the pull up controlling module in a third stage gate driving unit, a drain of the twenty-fifth switch transistor inputs the third reference level; a gate of the twenty-sixth switch transistor is connected a gate of the thirty-fourth switch transistor, a source of the twenty-sixth switch transistor inputs the first reference level; a gate of the twenty-seventh switch transistor is connected to an output terminal of the pull up controlling module in a second stage gate driving unit, a drain of the twenty-seventh switch transistor inputs the second reference level, a source of the twenty-seventh switch transistor is connected to a drain of the twenty-eighth switch transistor; a gate and a source of the twenty-eighth switch transistor input the first reference level; a gate of the twenty-ninth switch transistor is connected to the output terminal of the pull up controlling module in the second stage gate driving unit, a drain of the twenty-ninth switch transistor is connected to the drain of the twenty-fifth switch transistor, a source of the twenty-ninth switch transistor is a second output terminal of the inverter and is connected to the gate of the eighth switch transistor in the second stage gate driving unit; a gate of the thirtieth switch transistor is connected to the source of the twenty-seventh switch transistor, a source of the thirtieth switch transistor inputs the first reference level, a drain of the thirtieth switch transistor is connected to the source of the twenty-ninth switch transistor; a gate of the thirty-first switch transistor is connected to an output terminal of the pull up controlling module in the third stage gate driving unit, a drain of the thirty-first switch transistor inputs the second reference level, a source of the thirty-first switch transistor is connected to a drain of the thirty-second switch transistor; a gate and a source of the thirty-second switch transistor input the first reference level; a gate of the thirty-third switch transistor is connected to the gate of the thirty-first switch transistor, a drain of the thirty-third switch transistor is connected to the source of the twenty-fifth switch transistor, a source of the thirty-third switch transistor is a third output terminal of the inverter and is connected to the gate of the eighth switch transistor in the third stage gate driving unit; a gate of the thirty-fourth switch transistor is connected to the source of the thirty-first switch transistor, a source of the thirty-fourth switch transistor inputs the first reference level, a drain of the thirty-fourth switch transistor is connected to the source of the thirty-third switch transistor.

The present disclosure further provides a gate driving circuit, which includes a plurality of gate driving units connected in cascade, each of the gate driving units is used to drive two scan lines arranged continuously, and the gate driving circuit includes: a pull up controlling module for generating a scan level signal according to a former stage cascading signal; a first pull up module for pulling up a gate driving signal of a first scan line in the two scan lines according to the scan level signal and a first clock signal; a second pull up module for pulling a gate driving signal of a second scan line in the two scan lines according to the scan level signal and a second clock signal; a first down transmitting module for generating a first cascading signal according to the scan level signal; a second down transmitting module for generating a second cascading signal according to the scan level signal; a pull down module for pulling down gate driving signals of the first scan line and the second scan line; a first bootstrap capacitor for generating a low level of the gate driving signal of the first scan line; a second bootstrap capacitor for generating a low level of the gate driving signal of the second scan line; and a pull down holding module for holding the low level of the gate driving signals of the first scan line and the second scan line; wherein, the first clock signal is shifted in ¼ clock period to obtain the second clock signal.

In one embodiment, the pull up controlling module comprises a first switch transistor having a gate for inputting the former stage cascading signal, a source for connecting to a first reference level, and a drain for connecting to the first pull up module, the second pull up module, the first down transmitting module, the second down transmitting module, the first bootstrap capacitor, the second bootstrap capacitor and the pull down holding module.

In one embodiment, the first pull up module comprises a second switch transistor having a gate for connecting to the drain of the first switch transistor, a drain for inputting the first clock signal, and a source for outputting the gate driving signal of the first scan line; and the first down transmitting module comprises a third switch transistor having a gate for connecting to the drain of the first switch transistor, a drain for inputting the first clock signal, and a source for outputting a first cascading signal.

In one embodiment, the second pull up module comprises a fourth switch transistor having a gate for connecting to the drain of the first switch transistor, a drain for inputting the second clock signal, a source for outputting the gate driving signal of the second scan line.

In one embodiment, the second down transmitting module comprises a fifth switch transistor having a gate for connecting to the drain of the first switch transistor, a drain for inputting the second clock signal, and a source for outputting a second cascading signal.

In one embodiment, the pull down module comprises a sixth switch transistor and a seventh switch transistor, wherein a gate of the sixth switch transistor inputs a next stage cascading signal or a next stage gate driving signal, a drain of the sixth switch transistor is connected to the first switch transistor, a source of the sixth switch transistor is connected to a drain of the seventh switch transistor; a gate of the seventh switch transistor inputs a third clock signal, and a source of the seventh switch transistor is connected to the gate driving signal of the first scan line.

In one embodiment, the pull down holding module comprises an inverter, an eighth switch transistor, a ninth switch transistor, a tenth switch transistor, a eleventh switch transistor and a twelfth switch transistor: an input terminal of the inverter is connected to the drain of the first switch transistor, an output terminal of the inverter is connected to a gate of the eighth switch transistor, a gate of the ninth switch transistor, a gate of the tenth switch transistor and a gate of the eleventh switch transistor, a drain of the eighth switch transistor is connected to the drain of the first switch transistor, a source of the eighth switch transistor is connected to a source of the eleventh switch transistor, a drain of the ninth switch transistor inputs a second reference level, a source of the ninth switch transistor is connected to the gate driving signal of the first scan line, a drain of the tenth switch transistor inputs the second reference level, a source of the tenth switch transistor is connected to the gate driving signal of the second scan line, a drain of the eleventh switch transistor inputs a third reference level, a source of the eleventh switch transistor is connected to a drain of the twelfth switch transistor, a gate of the twelfth switch transistor is connected to the drain of the first switch transistor, and a source of the twelfth switch transistor inputs the first reference level.

In one embodiment, the inverter comprises a major inverting module and an auxiliary inverting module, the major inverting module comprises: a thirteenth switch transistor, a fourteenth switch transistor, a fifteenth switch transistor and a sixteenth switch transistor, and the auxiliary inverting module comprises a seventeenth switch transistor and an eighteenth switch transistor, a gate of the thirteenth switch transistor is connected to the drain of the first switch transistor, a drain of the thirteenth switch transistor inputs the second reference level, a source of the thirteenth switch transistor is connected to a drain of the fourteenth switch transistor, a gate and a source of the fourteenth switch transistor input the first reference level; a gate of the fifteenth switch transistor is connected to the drain of the first switch transistor, a drain of the fifteenth switch transistor is connected to a source of the seventeenth switch transistor, a source of the fifteenth switch transistor is the output terminal of the inverter and is connected to a drain of the sixteenth switch transistor; a gate of the sixteenth switch transistor is connected to the source of the thirteenth switch transistor, a source of the sixteenth switch transistor inputs the first reference level; a gate of the seventeenth switch transistor is connected to the drain of the first switch transistor, a drain of the seventeenth switch transistor inputs the third reference level, a gate of the eighteenth switch transistor is connected to the gate of the sixteenth switch transistor, a source of the eighteenth switch transistor inputs the first reference level, a drain of the eighteenth switch transistor is connected to the source of the seventeenth switch transistor.

In one embodiment, the gate driving units connected in three successive stages share the inverter.

In one embodiment, the inverter comprises three major inverting modules and one auxiliary inverting module, a first major inverting module comprises: a nineteenth switch transistor, a twentieth switch transistor, a twenty-first switch transistor and a twenty-second switch transistor, the auxiliary inverting module comprises a twenty-third switch transistor, a twenty-fourth switch transistor, a twenty-fifth switch transistor and a twenty-sixth switch transistor; a second major inverting module comprises: a twenty-seventh switch transistor, a twenty-eighth switch transistor, a twenty-ninth switch transistor and a thirtieth switch transistor; a third major inverting module comprises: a thirty-first switch transistor, a thirty-second switch transistor, a thirty-third switch transistor and a thirty-fourth switch transistor; a gate of the nineteenth switch transistor is connected to an output terminal of the pull up controlling module in a first stage gate driving unit, a drain of the nineteenth switch transistor inputs the second reference level, a source of the nineteenth switch transistor is connected to a drain of the twentieth switch transistor, a gate and a source of the twentieth switch transistor input the first reference level; a gate of the twenty-first switch transistor is connected to the output terminal of the pull up controlling module, a drain of the twenty-first switch transistor is connected to a source of the twenty-fifth switch transistor, a source of the twenty-first switch transistor is the first output terminal of the inverter and is connected to the gate of the eighth switch transistor in the first stage gate driving unit, a gate of the twenty-second switch transistor is connected to the source of the nineteenth switch transistor, a source of the twenty-second switch transistor inputs the first reference level, a drain of the twenty-second switch transistor is connected to the source of the twenty-first switch transistor; a gate of the twenty-third switch transistor is connected to the output terminal of the pull up controlling module, a drain of the twenty-third switch transistor inputs the third reference level, a source of the twenty-third switch transistor is connected to the source of the twenty-fifth switch transistor; a gate of the twenty-fourth switch transistor is connected to the gate of the twenty-second switch transistor, a drain of the twenty-fourth switch transistor is connected to the source of the twenty-fifth switch transistor, a source of the twenty-fourth switch transistor is connected to a drain of the twenty-sixth switch transistor; a gate of the twenty-fifth switch transistor is connected to an output terminal of the pull up controlling module in a third stage gate driving unit, a drain of the twenty-fifth switch transistor inputs the third reference level; a gate of the twenty-sixth switch transistor is connected a gate of the thirty-fourth switch transistor, a source of the twenty-sixth switch transistor inputs the first reference level; a gate of the twenty-seventh switch transistor is connected to an output terminal of the pull up controlling module in a second stage gate driving unit, a drain of the twenty-seventh switch transistor inputs the second reference level, a source of the twenty-seventh switch transistor is connected to a drain of the twenty-eighth switch transistor; a gate and a source of the twenty-eighth switch transistor input the first reference level; a gate of the twenty-ninth switch transistor is connected to the output terminal of the pull up controlling module in the second stage gate driving unit, a drain of the twenty-ninth switch transistor is connected to the drain of the twenty-fifth switch transistor, a source of the twenty-ninth switch transistor is a second output terminal of the inverter and is connected to the gate of the eighth switch transistor in the second stage gate driving unit; a gate of the thirtieth switch transistor is connected to the source of the twenty-seventh switch transistor, a source of the thirtieth switch transistor inputs the first reference level, a drain of the thirtieth switch transistor is connected to the source of the twenty-ninth switch transistor; a gate of the thirty-first switch transistor is connected to an output terminal of the pull up controlling module in the third stage gate driving unit, a drain of the thirty-first switch transistor inputs the second reference level, a source of the thirty-first switch transistor is connected to a drain of the thirty-second switch transistor; a gate and a source of the thirty-second switch transistor input the first reference level; a gate of the thirty-third switch transistor is connected to the gate of the thirty-first switch transistor, a drain of the thirty-third switch transistor is connected to the source of the twenty-fifth switch transistor, a source of the thirty-third switch transistor is a third output terminal of the inverter and is connected to the gate of the eighth switch transistor in a third stage gate driving unit; a gate of the thirty-fourth switch transistor is connected to the source of the thirty-first switch transistor, a source of the thirty-fourth switch transistor inputs the first reference level, a drain of the thirty-fourth switch transistor is connected to the source of the thirty-third switch transistor.

By the above scheme, the beneficial effect of the disclosure is: each of the gate driving units of the disclosure includes a pull up controlling module for generating a scan level signal according to a former stage cascading signal, a first pull up module for pulling up a gate driving signal of a first scan line in the two scan lines according to the scan level signal and a first clock signal, a second pull up module for pulling a gate driving signal of a second scan line in the two scan lines according to the scan level signal and a second clock signal, a first down transmitting module for generating a first cascading signal according to the scan level signal, a second down transmitting module for generating a second cascading signal according to the scan level signal, a pull down module for pulling down gate driving signals of the first scan line and the second scan line, a first bootstrap capacitor, a second bootstrap capacitor, and a pull down holding module for holding the low level of the gate driving signals of the first scan line and the second scan line, such that each of the gate driving units respectively drives two scan lines arranged continuously, thereby being capable of decreasing the amount of the components of GOA circuit, thus achieving the ultra-narrow frame design.

BRIEF DESCRIPTION OF THE DRAWINGS

In order to more clearly illustrate the prior art or the embodiments or aspects of the practice of the disclosure, the accompanying drawings for illustrating the prior art or the embodiments of the disclosure are briefly described as below. It is apparently that the drawings described below are merely some embodiments of the disclosure, and those skilled in the art may derive other drawings according the drawings described below without creative endeavor. In drawings.

DETAILED DESCRIPTION

The present disclosure will now be combined with the implementation of the drawings, were a clear example of the technical solutions of the present disclosure a complete description of, obviously, the described embodiments are only part of the embodiments of the present disclosure but not all embodiments. Based on the embodiments of the present disclosure all other embodiments by those of ordinary skill in the creative work did not make the premise obtained are within the scope of protection of the present disclosure.

Figure 1:
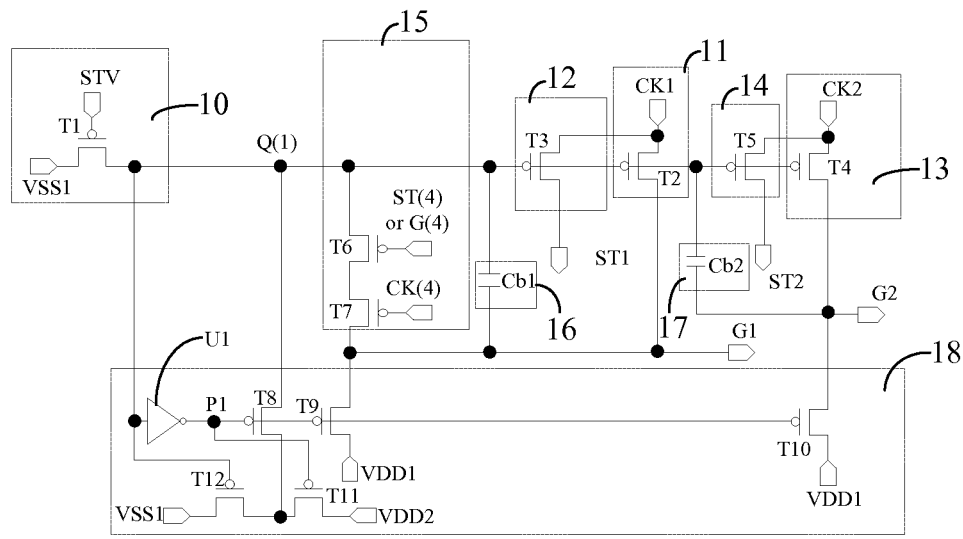
FIG. 1 is a circuit schematic view of a gate driving unit according to a first embodiment of the present disclosure.

Please refer to FIG. 1. FIG. 1 is a schematic view of a gate driving circuit according to an embodiment of the present disclosure. As shown in FIG. 1, the gate driving circuit includes a plurality of gate driving units 1 connected in cascade, each of the gate driving units 1 is used to drive two scan lines arranged continuously, and the gate driving circuit includes: a pull up controlling module 10, a first pull up module 11, a second pull up module 12, a first down transmitting module 13, a second down transmitting module 14, a pull down module 15, a first bootstrap capacitor 16, a second bootstrap capacitor 17 and a pull down holding module 18.

The pull up controlling module 10 is used for generating a scan level signal Q(2N−1) according to a former stage cascading signal ST(2N−2). The first pull up module 11 is used for pulling up a gate driving signal G(2N−1) of a first scan line in the two scan lines according to the scan level signal Q(2N−1) and a first clock signal CK(n). The second pull up module 12 is used for pulling a gate driving signal G(2N) of a second scan line in the two scan lines according to the scan level signal Q(2N−1) and a second clock signal CK(n+1). The first down transmitting module 13 is used for generating a first cascading signal ST(2N−1) according to the scan level signal Q(2N−1). The second down transmitting module 14 is used for generating a second cascading signal ST(2N) according to the scan level signal Q(2N−1). The pull down module 15 is used for pulling down gate driving signals G(2N−1) and G(2N) of the first scan line and the second scan line. The first bootstrap capacitor 16 is used for generating a low level of the gate driving signal G(2N−1) of the first scan line. The second bootstrap capacitor 17 is used for generating a low level of the gate driving signal G(2N) of the second scan line. The pull down holding module 18 is used for holding the low level of the gate driving signals G(2N−1) and G(2N) of the first scan line and the second scan line. In the embodiment of the present disclosure, each of the gate driving units 1 includes two pull up module 11, 12 and two down transmitting module 13, 14, it may output two gate driving signals G(2N−1) and G(2N) to respectively drive two scan lines arranged continuously, and other parts thereof may be shared, being capable of decreasing a component quantity of GOA circuit, thus achieving the ultra-narrow frame design.

In a more specific embodiment, the pull up controlling module 10 includes a first switch transistor T1. A gate of the first switch transistor T1 inputs the former stage cascading signal ST(2N−2), a source of the first switch transistor T1 is connected to a first reference level VSS1, and a drain of the first switch transistor T1 is connected to the first pull up module 11, the second pull up module 12, the first down transmitting module 13, the second down transmitting module 14, the first bootstrap capacitor 16, the second bootstrap capacitor 17 and the pull down holding module 18, wherein the common connecting point is referred to the first controlling node Q(2N−1). The first reference level VSS1 is a constant voltage negative level.

The first pull up module 11 includes a second switch transistor T2. A gate of the second switch transistor T2 is connected to the drain of the first switch transistor T1, a drain of the second switch transistor T2 inputs the first clock signal CK(n), and a source of the second switch transistor T2 outputs the gate driving signal G(2N−1) of the first scan line. The first down transmitting module 13 includes a third switch transistor T3. A gate of the third switch transistor T3 is connected to the drain of the first switch transistor T1, a drain of the third switch transistor T3 inputs the first clock signal CK(n), and a source of the third switch transistor T3 outputs a first cascading signal ST(2N−1). The second pull up module 12 includes a fourth switch transistor T4. A gate of the fourth switch transistor T4 is connected to the drain of the first switch transistor T1, a drain of the fourth switch transistor T4 inputs the second clock signal CK(n+1), and a source of the fourth switch transistor T4 outputs the gate driving signal G(2N) of the second scan line. The second down transmitting module 14 includes a fifth switch transistor T5. A gate of the fifth switch transistor T5 is connected to the drain of the first switch transistor T1, a drain of the fifth switch transistor T5 inputs the second clock signal CK(n+1), and a source of the fifth switch transistor T5 outputs a second cascading signal ST(2N). The first pull up module 11 and the second pull up module 12 and the first down transmitting module 13 and the second down transmitting module 14 share the first controlling node Q(2N−1), it is capable of outputting two successive gate drive signals G(2N−1) and G(2N) to drive the two scan lines arranged continuously, and other parts can be shared, such that it is originally required to drive two successive scan lines by using two stage gate driving units, but the embodiment of the disclosure can be achieved by using one stage gate driving unit, thereby being capable of decreasing a component quantity of GOA circuit, i.e. at least twelve TFT elements are decreased in every two stages, thus achieving the ultra-narrow frame design. Wherein, the first clock signal CK(n) is shifted ¼ clock period to obtain the second clock signal CK(n+1). Of course, the second clock signal CK(n+1) may be inputted directly, rather than by shifting the first clock signal CK(n) to obtain, and this is not limited.

The pull down module 15 includes a sixth switch transistor T6 and a seventh switch transistor T7. A gate of the sixth switch transistor T6 inputs a next stage cascading signal ST(2N+2) or a next stage gate driving signal G(2N+2), a drain of the sixth switch transistor T6 is connected to the first switch transistor T1, a source of the sixth switch transistor T6 is connected to a drain of the seventh switch transistor T7. A gate of the seventh switch transistor T7 inputs a third clock signal CK(n+3), and a source of the seventh switch transistor T7 is connected to the gate driving signal G(2N−1) of the first scan line. Wherein, the third clock signal CK(n+3) may be obtained by shifting ¾ clock period for the first clock signal CK(n).

The pull down holding module 18 includes an inverter U1, an eighth switch transistor T8, a ninth switch transistor T9, a tenth switch transistor T10, a eleventh switch transistor T11 and a twelfth switch transistor T12. An input terminal of the inverter U1 is connected to the drain of the first switch transistor T1, and an output terminal of the inverter U1 is connected to a gate of the eighth switch transistor T8, a gate of the ninth switch transistor T9, a gate of the tenth switch transistor T10 and a gate of the eleventh switch transistor T11. A drain of the eighth switch transistor T8 is connected to the drain of the first switch transistor T1, and a source of the eighth switch transistor T8 is connected to a source of the eleventh switch transistor T11. A drain of the ninth switch transistor T9 inputs a second reference level VDD1, and a source of the ninth switch transistor T9 is connected to the gate driving signal G(2N−1) of the first scan line. A drain of the tenth switch transistor T10 inputs the second reference level VDD1, and a source of the tenth switch transistor T10 is connected to the gate driving signal G(2N) of the second scan line. A drain of the eleventh switch transistor T11 inputs a third reference level VDD2, a source of the eleventh switch transistor T11 is connected to a drain of the twelfth switch transistor T12. A gate of the twelfth switch transistor T12 is connected to the drain of the first switch transistor T1, and a source of the twelfth switch transistor T12 inputs the first reference level VSS1. Wherein, the second reference level VDD1 and the third reference level VDD2 are a constant voltage positive level, and a potential of the third reference level VDD2 is higher than a potential of the second reference level VDD1.

The above switch transistors are all P type thin film transistor. N and n are a positive integer.

Figure 2:
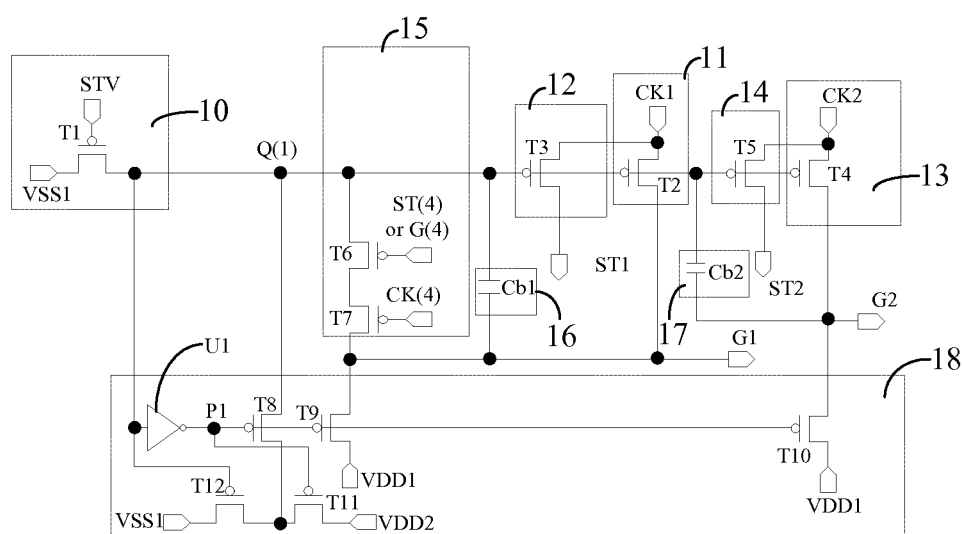
FIG. 2 is a circuit schematic view of the gate driving unit used in the first stage in FIG. 1.
Figure 3:
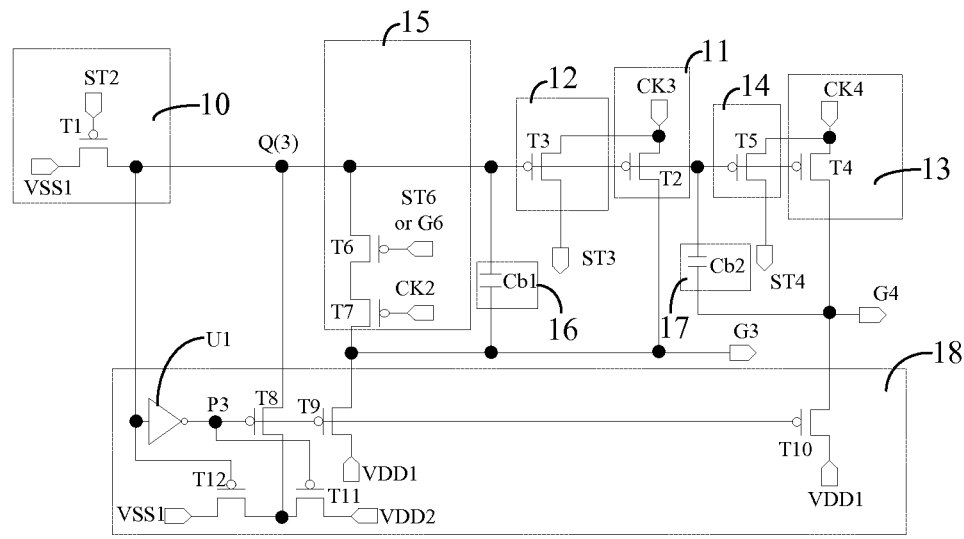
FIG. 3 is a circuit schematic view of the gate driving unit used in the second stage in FIG. 1.

FIG. 2 is a circuit schematic view of the gate driving unit 1 used in the first stage in FIG. 1. As shown in FIG. 2, the gate of the first switch transistor T1 inputs a start signal STV, the first clock signal inputted by the first pull up module is the clock signal CK1, and the second clock signal inputted by the second pull up module is the clock signal CK2. Wherein, the clock signal CK2 may be obtained by shifting ¼ period for the clock signal CK1. The driving signal G1 of the first scan line is outputted by the second switch transistor T2, the driving signal G2 of the second scan line is outputted by the fourth switch transistor T4, the first cascading signal ST1 is outputted by the third switch transistor T3, and the second cascading signal ST2 is outputted by the fifth switch transistor ST2. FIG. 3 is a circuit schematic view of the gate driving unit 1 used in the second stage in FIG. 1. As shown in FIG. 3, the gate of the first switch transistor T1 inputs the second cascading signal ST2 which is outputted by the first stage gate driving unit. The first clock signal inputted by the first pull up module 11 is the clock signal CK3, and the second clock signal inputted by the second pull up module 12 is the clock signal CK4. Wherein, the clock signal CK3 may be obtained by shifting ¼ period for the clock signal CK2, and the clock signal CK4 may be obtained by shifting ¼ period for the clock signal CK3. The gate driving signal G3 of the third scan line and the gate driving signal G4 of the fourth scan line are outputted by the second switch transistor T2 and the fourth switch transistor T4, respectively; meanwhile, the third cascading signal ST3 and the fourth cascading signal ST4 are outputted by the third switch transistor T3 and the fifth switch transistor T5, respectively.

The working process of the gate driving unit 1 in FIG. 1 is as follows:

When the former stage cascading signal ST(2N−2) is a low potential, the first switch transistor is turned on to charge the first bootstrap capacitor 16 and the second bootstrap capacitor 17, such that the first node Q(N) gets a negative level to activate the gate driving unit 1. Then, the former stage cascading signal ST(2N−2) changes to a high potential, the first controlling node Q(2N−1) located in the drain of the first switch transistor T1 holds the negative level through the first bootstrap capacitor Cb1 and the second bootstrap capacitor Cb2. Next, the second switch transistor T2, the third switch transistor T3, the fourth switch transistor T4 and the fifth switch transistor T5 are turned on by a control of the first controlling node Q(2N−1), at this time, the low level of the first clock signal CK(n) arrives, and the first bootstrap capacitor continues to charge by the second switch transistor T2 and the third switch transistor T3, such that the first controlling node Q(2N−1) reaches the lower negative potential. At the same time, the source of the second switch transistor T2 outputs the low level of the first cascading signal ST(2N−1), and the third switch transistor T3 outputs the low level of gate driving signal G(2N−1) of the first scan line. For PMOS gate driving circuit, the scan driving signal which is general a time slot of the low potential is referred to an action period.

During the action period, since the first controlling node Q (2N−1) is a low potential, the second controlling node P(2N−1) obtained by the inverter U1 inverts is a high potential, the twelfth switch transistor T12 in the pull down holding module 18 is turned on, and the eleventh switch transistor T11, the eighth switch transistor T8, the ninth switch transistor T9 and the tenth switch transistor T10 are turned off. A potential of the source of the eighth switch transistor T8 is pulled down to the first reference level, thereby being capable of decreasing the leakage of the first control node Q (2N−1) through the eighth switch transistor T8. Additionally, since the twelfth switch transistor is turned on, the first control node Q(2N−1) is approximately maintain the first reference level VSS1, while using the first reference level VSS1 to transmitting the signal of the first switch transistor T1, so as to also decrease the leakage of the first control node Q(2N−1).

Then, the first clock signal CK(n) changes to a high potential, the gate driving signal G(2N−1) of the first scan line outputted by the source of the second switch transistor T2 and the first cascading signal ST(2N−1) outputted by the source of the third switch transistor T3 also correspondingly change to the high potential. The fourth switch transistor T4 and the fifth switch transistor T5 continue to turn on by a control of the first controlling node Q(2N−1), at this time, the low level of the second clock signal CK(n+1) arrives, the second bootstrap capacitor Cb2 is charged by the fourth switch transistor T4 and the fifth switch transistor T5, such that the first controlling node Q(2N−1) continues to maintain the negative potential. At the same time, the source of the fourth switch transistor T4 outputs the low level of the second cascading signal ST(2N), and the source of the fifth switch transistor T5 outputs the low level of the gate driving signal G(2N) of the second scan line.

After, the second clock signal CK(n+1) changes to a high potential, the gate driving signal G(2N) of the second scan line outputted by the fourth switch transistor T4 and the second cascading signal ST(2N) outputted by the fifth switch transistor T5 also correspondingly change to the high potential, and the circuit enters into a non-action period. When the third clock signal CK(n+3) and the low potential of the next stage cascading signal ST(2N+2) or the next stage gate driving signal G(2N+2) arrive, the sixth switch transistor T6 and the seventh switch transistor T7 are turned on, a potential of the first controlling node Q(2N−1) is pulled up to the high potential of the gate driving signal G(2N−1) of the first scan line, and the second switch transistor T2, the third switch transistor T3, the fourth switch transistor T4 and the fifth switch transistor T5 are tuned off.

During the non-action period, since the first controlling node Q(2N−1) is the high potential, the second controlling node P(2N−1) obtained by the inverter U1 inverts is the low potential. The twelfth switch transistor T12 in the pull down holding module 18 is turned off, and the eighth switch transistor T8, the ninth switch transistor T9, the tenth switch transistor T10 and the eleventh switch transistor T11 are turned on, the potential of the first controlling node Q(2N−1) is pulled up to and maintained in the third reference level VDD2 by the eighth switch transistor T8 and the eleventh switch transistor T11. The potentials of the gate driving signal G(2N−1) of the first scan line and the gate driving signal G(2N) of the second scan line are maintained in the second reference level VDD1 by the ninth switch transistor T9 and the tenth switch transistor T10, respectively.

Figure 4:
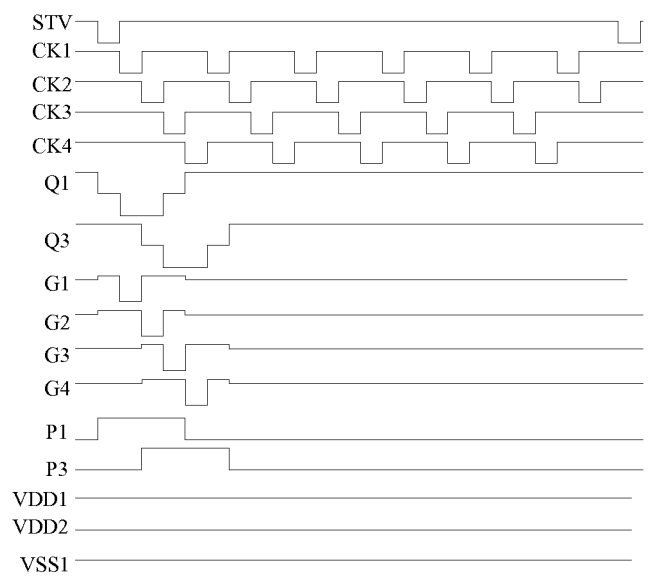
FIG. 4 is a waveform schematic view of the gate driving unit in FIG. 1.

In an example of the gate driving unit 1 in FIG. 2 and FIG. 3, the first stage gate driving unit in FIG. 2 and the second stage gate driving unit in FIG. 3 are connected in cascade and the waveforms thereof are shown in FIG. 4. When a start pulse STV is a low level, the first stage gate driving unit is activated, and during the first controlling node Q(1) is the low level, the corresponding second controlling node P1 is the high level, the low potentials of the first clock signal CK1 and the second clock signal CK2 of the first stage gate driving unit arrive in turn, the gate driving signal G1 of the first scan line and the gate driving signal G2 of the second scan line are correspondingly outputted, respectively. The second stage gate driving unit is activated by the low level of the second cascading signal ST2, wherein the low level of the second cascading signal ST2 and the gate driving signal G2 of the second scan line are outputted at the same time. During the first controlling node Q(3) is a low level, the corresponding second controlling node P3 is a high level, the low potentials of the first clock signal CK3 and the second clock signal CK4 of the second stage gate driving unit arrive in turn, the gate driving signal G3 of the third scan line and the gate driving signal G4 of the fourth scan line are correspondingly outputted, respectively.

Figure 5:
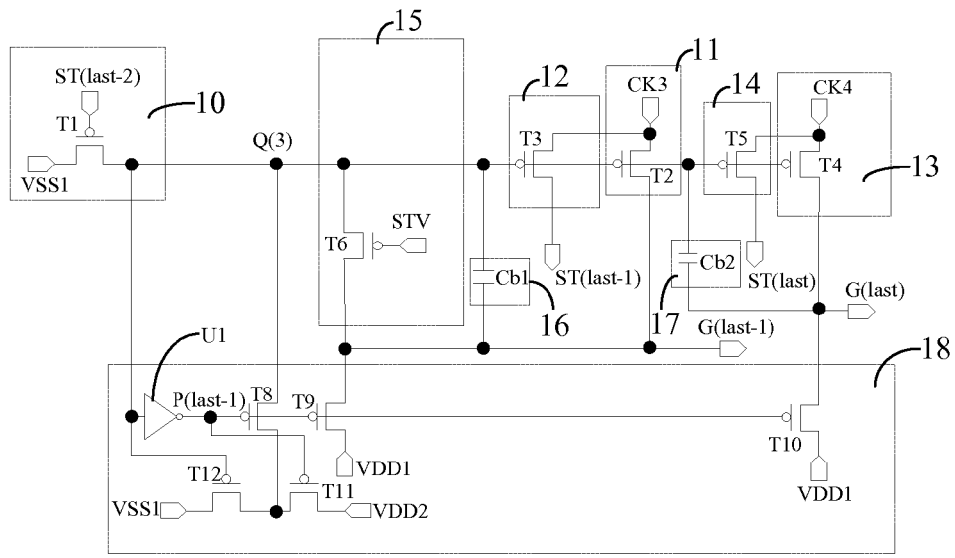
FIG. 5 is a circuit schematic view of the gate driving unit used in the last stage in FIG. 1.

FIG. 5 is a circuit schematic view of the gate driving unit 1 used in the last stage in FIG. 1. As shown in FIG. 5, the gate of the first switch transistor T1 inputs the second cascading signal ST(last-2) which is outputted by the former stage gate driving unit, the first clock signals inputted by the first pull up module 11 and the first down transmitting module 12 are CK3, and the gate driving signal G(last-1) of the penultimate scan line and the penultimate down transmitting signal ST(last-1) are outputted, respectively. The second clock signals inputted by the second pull up module 13 and the second down transmitting module 14 are CK4, and the gate driving signal G(last) of the last scan line and the last down transmitting signal ST(last) are outputted, respectively. The gate of the six switch transistor is connected to the start pulse STV, and the seventh switch transistor is removed at the same time.

Figure 6:
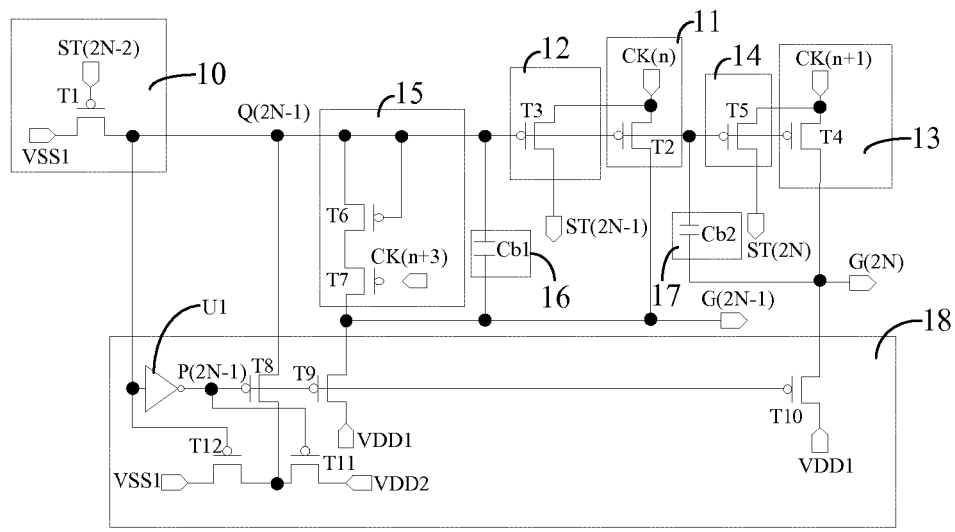
FIG. 6 is a circuit schematic view of a gate driving unit according to a second embodiment of the present disclosure.
Figure 7:
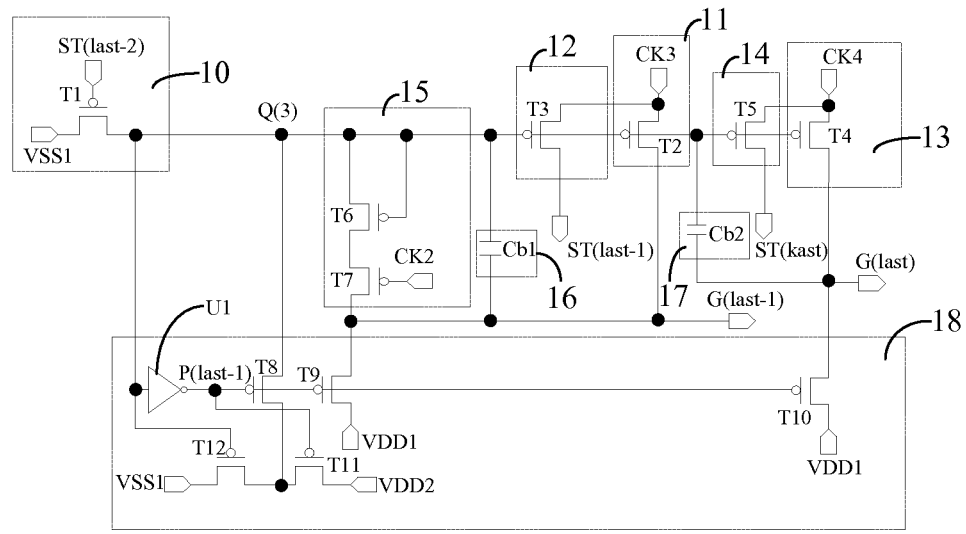
FIG. 7 is a circuit schematic view of the gate driving unit used in the last stage in FIG. 6.

FIG. 6 is a circuit schematic view of a gate driving unit according to a second embodiment of the present disclosure. As shown in FIG. 6, the difference between the gate driving units in FIG. 6 and FIG. 1 is that: the sixth switch transistor T6 uses a diode connection, i.e. the drain and the gate of the sixth switch T6 are connected to the first controlling node, as the drain of the first switch transistor T1. As shown in FIG. 7, the circuit of the corresponding last stage gate driving unit retains the seventh switch transistor T7, and the gate of the seventh switch transistor T7 is connected to the second clock signal CK2.

Figure 8:
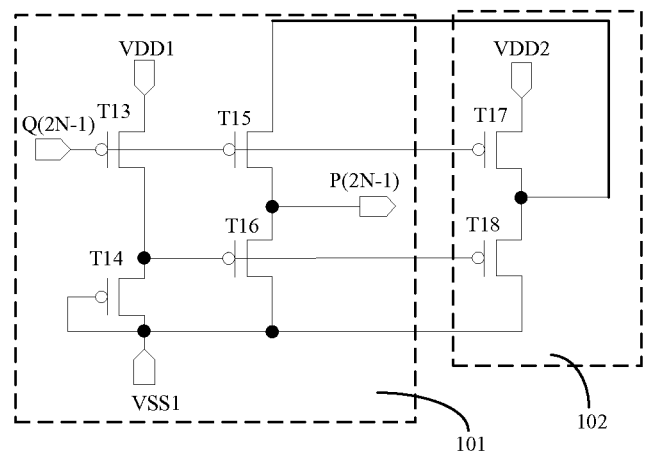
FIG. 8 is a circuit schematic view of an inverter according to the first embodiment of the present disclosure.

Further, as shown in FIG. 8, the inverter U1 in the pull down holding module 18 includes a major inverting module 101 and an auxiliary inverting module 102. The major inverting module 101 includes: a thirteenth switch transistor T13, a fourteenth switch transistor T14, a fifteenth switch transistor T15 and a sixteenth switch transistor T16. The auxiliary inverting module 102 includes a seventeenth switch transistor T17 and an eighteenth switch transistor T18. A gate of the thirteenth switch transistor T13 is connected to the drain of the first switch transistor T1, a drain of the thirteenth switch transistor T13 inputs the second reference level VDD1, a source of the thirteenth switch transistor T13 is connected to a drain of the fourteenth switch transistor T14. A gate and a source of the fourteenth switch transistor T14 input the first reference level VSS1. A gate of the fifteenth switch transistor T15 is connected to the drain of the first switch transistor T1, a drain of the fifteenth switch transistor T15 is connected to a source of the seventeenth switch transistor T17, a source of the fifteenth switch transistor T15 is the output terminal of the inverter U1 and is connected to a drain of the sixteenth switch transistor T16. A gate of the sixteenth switch transistor T16 is connected to the source of the thirteenth switch transistor T13, a source of the sixteenth switch transistor T16 inputs the first reference level VSS1. A gate of the seventeenth switch transistor T17 is connected to the drain of the first switch transistor T1, a drain of the seventeenth switch transistor T17 inputs the third reference level VDD2. A gate of the eighteenth switch transistor T18 is connected to the gate of the sixteenth switch transistor T16, a source of the eighteenth switch transistor T18 inputs the first reference level VSS1, a drain of the eighteenth switch transistor T18 is connected to the source of the seventeenth switch transistor T17.

The working process of the inverter U1 is as follows:

When the first controlling node Q(2N-1) is a low potential, in the major inverting module 101, the thirteenth switch transistor T13 and the fifteenth switch transistor T15 are turned on, and the fourteenth switch transistor T14 and the sixteenth switch transistor T16 are turned off. In the auxiliary inverting module 102, the seventeenth switch transistor T17 is turned on and the eighteenth switch transistor T18 is turned off. A potential of the second controlling node (2N-1) is pulled up to a potential which is higher than the potential of the third reference level VDD1 of the second reference level VDD1. When the first controlling node Q(2N-1) is a high potential, in the major inverting module 101, the thirteenth switch transistor T13 and the fifteenth switch transistor T15 are turned off, and the fourteenth switch transistor T14 and the sixteenth switch transistor T16 are turned on. In the auxiliary inverting module 102, the seventeenth switch transistor T17 is turned off and the eighteenth switch transistor T18 is turned on. The potential of the second controlling node (2N-1) is limited as the potential of the first reference level VSS1. Wherein, the second controlling node P(2N-1) is the output terminal of the inverter U1.

Figure 9:
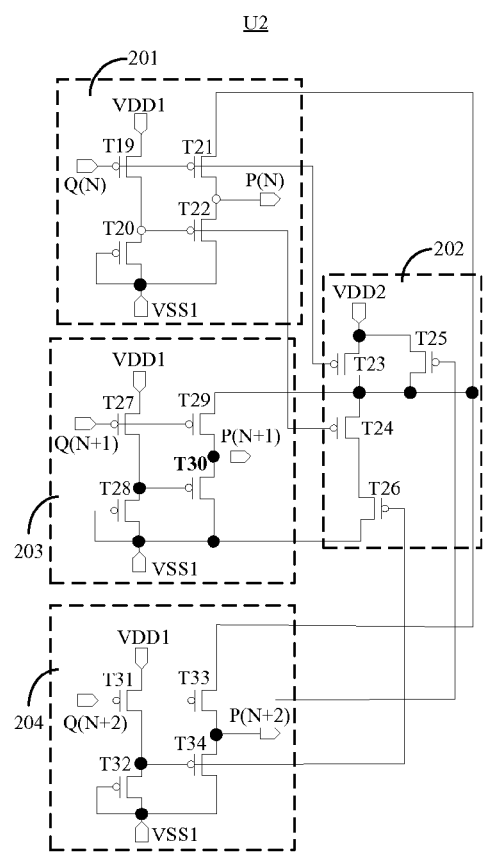
FIG. 9 is a circuit schematic view of an inverter according to the second embodiment of the present disclosure.

In the embodiment of the present disclosure, the gate driving units connected in three successive stages may share one inverter. As shown in FIG. 9, the inverter includes three major inverting modules 201, 203 and 204 and one auxiliary inverting module 202. A first major inverting module 201 includes: a nineteenth switch transistor T19, a twentieth switch transistor T20, a twenty-first switch transistor T21 and a twenty-second switch transistor T22. The auxiliary inverting module 202 includes a twenty-third switch transistor T23, a twenty-fourth switch transistor T24, a twenty-fifth switch transistor T25 and a twenty-sixth switch transistor T26. A second major inverting module 203 includes: a twenty-seventh switch transistor T27, a twenty-eighth switch transistor T28, a twenty-ninth switch transistor T29 and a thirtieth switch transistor T30. A third major inverting module 204 includes: a thirty-first switch transistor T31, a thirty-second switch transistor T32, a thirty-third switch transistor T33 and a thirty-fourth switch transistor T34. A gate of the nineteenth switch transistor T19 is connected to an output terminal of the pull up controlling module in a first stage gate driving unit, a drain of the nineteenth switch transistor T19 inputs the second reference level VDD1, a source of the nineteenth switch transistor T19 is connected to a drain of the twentieth switch transistor T20, a gate and a source of the twentieth switch transistor T20 input the first reference level VSS1. A gate of the twenty-first switch transistor T21 is connected to the output terminal of the pull up controlling module in the first stage gate driving unit, a drain of the twenty-first switch transistor T21 is connected to a source of the twenty-fifth switch transistor T25, a source of the twenty-first switch transistor T21 is the first output terminal P(N) of the inverter U2 and is connected to the gate of the eighth switch transistor in the first stage gate driving unit. A gate of the twenty-second switch transistor T22 is connected to the source of the nineteenth switch transistor T19, a source of the twenty-second switch transistor T22 inputs the first reference level VSS1, a drain of the twenty-second switch transistor T22 is connected to the source of the twenty-first switch transistor T21. A gate of the twenty-third switch transistor T23 is connected to the output terminal of the pull up controlling module in the first stage gate driving unit, a drain of the twenty-third switch transistor T23 inputs the third reference level VDD2, a source of the twenty-third switch transistor T23 is connected to the source of the twenty-fifth switch transistor T25. A gate of the twenty-fourth switch transistor T24 is connected to the gate of the twenty-second switch transistor T22, a drain of the twenty-fourth switch transistor T24 is connected to the source of the twenty-fifth switch transistor T25, a source of the twenty-fourth switch transistor T24 is connected to a drain of the twenty-sixth switch transistor T26. A gate of the twenty-fifth switch transistor T25 is connected to an output terminal of the pull up controlling module in a third stage gate driving unit, a drain of the twenty-fifth switch transistor T25 inputs the third reference level VDD2. A gate of the twenty-sixth switch transistor T26 is connected a gate of the thirty-fourth switch transistor T34, a source of the twenty-sixth switch transistor T26 inputs the first reference level VSS1. A gate of the twenty-seventh switch transistor T27 is connected to an output terminal of the pull up controlling module in a second stage gate driving unit, a drain of the twenty-seventh switch transistor T27 inputs the second reference level VDD1, a source of the twenty-seventh switch transistor T27 is connected to a drain of the twenty-eighth switch transistor T28. A gate and a source of the twenty-eighth switch transistor T28 input the first reference level VSS1. A gate of the twenty-ninth switch transistor T29 is connected to the output terminal of the pull up controlling module in the second stage gate driving unit, a drain of the twenty-ninth switch transistor T29 is connected to the drain of the twenty-fifth switch transistor T25, a source of the twenty-ninth switch transistor T29 is a second output terminal P(N+1) of the inverter U2 and is connected to the gate of the eighth switch transistor in the second stage gate driving unit. A gate of the thirtieth switch transistor T30 is connected to the source of the twenty-seventh switch transistor T27, a source of the thirtieth switch transistor T30 inputs the first reference level VSS1, a drain of the thirtieth switch transistor T30 is connected to the source of the twenty-ninth switch transistor T29. A gate of the thirty-first switch transistor T31 is connected to an output terminal of the pull up controlling module in the third stage gate driving unit, a drain of the thirty-first switch transistor T31 inputs the second reference level VDD1, a source of the thirty-first switch transistor T31 is connected to a drain of the thirty-second switch transistor T32. A gate and a source of the thirty-second switch transistor T32 input the first reference level VSS1. A gate of the thirty-third switch transistor T33 is connected to the gate of the thirty-first switch transistor T31, a drain of the thirty-third switch transistor T33 is connected to the source of the twenty-fifth switch transistor T25, a source of the thirty-third switch transistor T33 is a third output terminal of the inverter U2 and is connected to the gate of the eighth switch transistor in the third stage gate driving unit. A gate of the thirty-fourth switch transistor T34 is connected to the source of the thirty-first switch transistor T31, a source of the thirty-fourth switch transistor T34 inputs the first reference level VSS1, a drain of the thirty-fourth switch transistor T34 is connected to the source of the thirty-third switch transistor T33.

The specific working process of the inverter U2 is similar to the inverter U1, thus the description is omitted.

Figure 10:
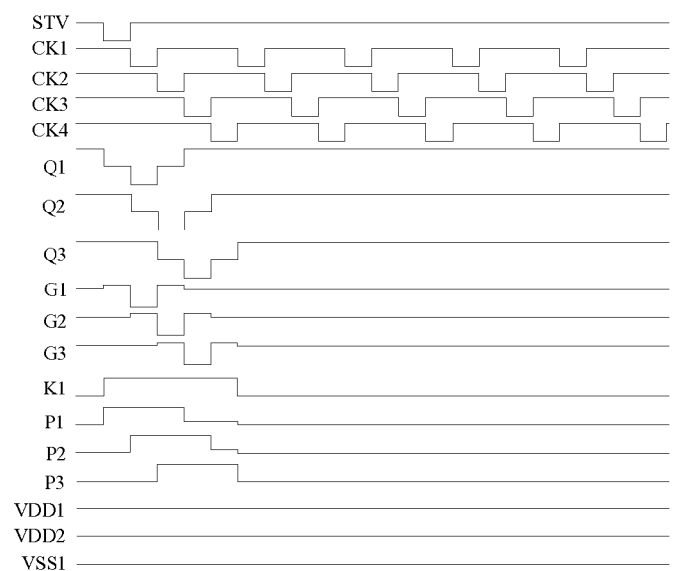
FIG. 10 is a waveform schematic view of the gate driving unit including the inverter in FIG. 9.

FIG. 10 is a waveform schematic view of the gate driving unit including the inverter in FIG. 9. As shown in FIG. 10, assuming N=1, M=1, P1 is the first output terminal of the inverter U2 and is connected to the gate of the eighth switch transistor in the first stage gate driving unit, P2 is the second output terminal of the inverter U2 and is connected to the gate of the eighth switch transistor in the second stage gate driving unit, and P3 is the third output terminal of the inverter U2 and is connected to the gate of the eighth switch transistor in the third stage gate driving unit. K1 is a shared node of the inverter U2 and located in the source of the twenty-fifth switch transistor T25. As can be seen from the figure, the potential of the first output terminal P1 of the inverter U2 and the potential of the first controlling node Q1 in the first stage gate driving unit are reverse, and at this time, the first major inverting module 201 is at the working period. The potential of the second output terminal P2 of the inverter U2 and the potential of the first controlling node Q2 in the second stage gate driving unit are reverse, and at this time, the second major inverting module 203 is at the working period. The potential of the third output terminal P3 of the inverter U2 and the potential of the first controlling node Q3 in the third stage gate driving unit are reverse, and at this time, the third major inverting module 204 is at the working period. The shared node K1 is all a high level when any one of major inverting modules works.

In summary, each of the gate driving units of the disclosure includes a pull up controlling module for generating a scan level signal according to a former stage cascading signal, a first pull up module for pulling up a gate driving signal of a first scan line in the two scan lines according to the scan level signal and a first clock signal, a second pull up module for pulling a gate driving signal of a second scan line in the two scan lines according to the scan level signal and a second clock signal, a first down transmitting module for generating a first cascading signal according to the scan level signal, a second down transmitting module for generating a second cascading signal according to the scan level signal, a pull down module for pulling down gate driving signals of the first scan line and the second scan line, a first bootstrap capacitor, a second bootstrap capacitor, and a pull down holding module for holding the low level of the gate driving signals of the first scan line and the second scan line, such that each of the gate driving units respectively drives two scan lines arranged continuously, thereby being capable of decreasing the amount of the components of GOA circuit, thus achieving the ultra-narrow frame design.

The above disclosures only are the embodiments of the present disclosure it can not be used to limit the scope of the present disclosure as claimed, Therefore, the equivalent changes is made according to the present disclosure as claimed, the scope of the present disclosure is still covered.

What is claimed is:

1. A gate driving circuit for a liquid crystal display device, comprising:
   a plurality of gate driving units configured to drive two scan lines, wherein the two scan lines are arranged continuously, and wherein the gate driving units are connected in cascade;
   a pull up controlling module configured to generate a scan level signal according to a former stage cascading signal;
   a first pull up module configured to pull up a gate driving signal of a first scan line in the two scan lines according to the scan level signal and a first clock signal;
   a second pull up module configured to pull up a gate driving signal of a second scan line in the two scan lines according to the scan level signal and a second clock signal;
   a first down transmitting module configured to generate a first cascading signal according to the scan level signal;

a second down transmitting module configured to generate a second cascading signal according to the scan level signal;

a pull down module configured to pull down the gate driving signals of the first scan line and the second scan line;

a first bootstrap capacitor configured to generate a low level of the gate driving signal of the first scan line;

a second bootstrap capacitor configured to generate a low level of the gate driving signal of the second scan line;

a pull down holding module configured to hold the low level of the gate driving signals of the first scan line and the second scan line;

wherein, the first clock signal is shifted in ¼ clock period to obtain the second clock signal, wherein the pull up controlling module comprises a first switch transistor having a gate for inputting the former stage cascading signal, a source for connecting to a first reference level, and a drain for connecting to the first pull up module, the second pull up module, the first down transmitting module, the second down transmitting module, the first bootstrap capacitor, the second bootstrap capacitor and the pull down holding module, wherein the first pull up module comprises a second switch transistor having a gate for connecting to the drain of the first switch transistor, a drain for inputting the first clock signal, and a source for outputting the gate driving signal of the first scan line; and the first down transmitting module comprises a third switch transistor having a gate for connecting to the drain of the first switch transistor, a drain for inputting the first clock signal, and a source for outputting a first cascading signal, wherein the second pull up module comprises a fourth switch transistor having a gate for connecting to the drain of the first switch transistor, a drain for inputting the second clock signal, a source for outputting the gate driving signal of the second scan line, wherein the second down transmitting module comprises a fifth switch transistor having a gate for connecting to the drain of the first switch transistor, a drain for inputting the second clock signal, and a source for outputting a second cascading signal, wherein the pull down module comprises a sixth switch transistor and a seventh switch transistor, wherein a gate of the sixth switch transistor inputs a next stage cascading signal or a next stage gate driving signal, a drain of the sixth switch transistor is connected to the drain of the first switch transistor, a source of the sixth switch transistor is connected to a drain of the seventh switch transistor; a gate of the seventh switch transistor inputs a third clock signal, and a source of the seventh switch transistor is connected to the gate driving signal of the first scan line, and wherein the pull down holding module comprises an inverter, an eighth switch transistor, a ninth switch transistor, a tenth switch transistor, a eleventh switch transistor and a twelfth switch transistor; an input terminal of the inverter is connected to the drain of the first switch transistor, an output terminal of the inverter is connected to a gate of the eighth switch transistor, a gate of the ninth switch transistor, a gate of the tenth switch transistor and a gate of the eleventh switch transistor, a drain of the eighth switch transistor is connected to the drain of the first switch transistor, a source of the eighth switch transistor is connected to a source of the eleventh switch transistor, a drain of the ninth switch transistor inputs a second reference level, a source of the ninth switch transistor is connected to the gate driving signal of the first scan line, a drain of the tenth switch transistor inputs the second reference level, a source of the tenth switch transistor is connected to the gate driving signal of the second scan line, a drain of the eleventh switch transistor inputs a third reference level, a source of the eleventh switch transistor is connected to a drain of the twelfth switch transistor, a gate of the twelfth switch transistor is connected to the drain of the first switch transistor, and a source of the twelfth switch transistor inputs the first reference level.

2. The gate driving circuit according to claim 1, wherein the inverter comprises a major inverting module and an auxiliary inverting module, wherein the major inverting module comprises: a thirteenth switch transistor, a fourteenth switch transistor, a fifteenth switch transistor and a sixteenth switch transistor, and the auxiliary inverting module comprises a seventeenth switch transistor and an eighteenth switch transistor, a gate of the thirteenth switch transistor is connected to the drain of the first switch transistor, a drain of the thirteenth switch transistor inputs the second reference level, a source of the thirteenth switch transistor is connected to a drain of the fourteenth switch transistor, a gate and a source of the fourteenth switch transistor input the first reference level; a gate of the fifteenth switch transistor is connected to the drain of the first switch transistor, a drain of the fifteenth switch transistor is connected to a source of the seventeenth switch transistor, a source of the fifteenth switch transistor is the output terminal of the inverter and is connected to a drain of the sixteenth switch transistor; a gate of the sixteenth switch transistor is connected to the source of the thirteenth switch transistor, a source of the sixteenth switch transistor inputs the first reference level; a gate of the seventeenth switch transistor is connected to the drain of the first switch transistor, a drain of the seventeenth switch transistor inputs the third reference level, a gate of the eighteenth switch transistor is connected to the gate of the sixteenth switch transistor, a source of the eighteenth switch transistor inputs the first reference level, a drain of the eighteenth switch transistor is connected to the source of the seventeenth switch transistor.

3. The gate driving circuit according to claim 1, wherein the gate driving units connected in three successive stages share the inverter.

4. The gate driving circuit according to claim 3, wherein the inverter further comprises a first major inverting module, a second major inverting module, and a third major inverting module, wherein a first major inverting module comprises: a nineteenth switch transistor, a twentieth switch transistor, a twenty-first switch transistor and a twenty-second switch transistor, the auxiliary inverting module comprises a twenty-third switch transistor, a twenty-fourth switch transistor, a twenty-fifth switch transistor and a twenty-sixth switch transistor;

wherein a second major inverting module comprises: a twenty-seventh switch transistor, a twenty-eighth switch transistor, a twenty-ninth switch transistor and a thirtieth switch transistor;

wherein a third major inverting module comprises: a thirty-first switch transistor, a thirty-second switch transistor, a thirty-third switch transistor and a thirty-fourth switch transistor; a gate of the nineteenth switch transistor is connected to an output terminal of the pull up controlling module in a first stage gate driving unit, a drain of the nineteenth switch transistor inputs the second reference level, a source of the nineteenth switch transistor is connected to a drain of the twentieth switch transistor, a gate and a source of the twentieth switch transistor input the first reference level; a gate of the twenty-first switch transistor is connected to the output terminal of the pull up controlling module, a drain of the twenty-first switch transistor is connected to a source of the twenty-fifth switch transistor, a source of the twenty-first switch transistor is the first output terminal of the inverter and is connected to the gate of the eighth switch transistor in the first stage gate driving unit, a gate of the twenty-second switch transistor is connected to the source of the nineteenth switch transistor, a source of the twenty-second switch transistor inputs the first reference level, a drain of the twenty-second switch transistor is connected to the source of the twenty-first switch transistor; a gate of the twenty-third switch transistor is connected to the output terminal of the pull up controlling module, a drain of the twenty-third switch transistor inputs the third reference level, a source of the twenty-third switch transistor is connected to the source of the twenty-fifth switch transistor; a gate of the twenty-fourth switch transistor is connected to the gate of the twenty-second switch transistor, a drain of the twenty-fourth switch transistor is connected to the source of the twenty-fifth switch transistor, a source of the twenty-fourth switch transistor is connected to a drain of the twenty-sixth switch transistor; a gate of the twenty-fifth switch transistor is connected to an output terminal of the pull up controlling module in a third stage gate driving unit, a drain of the twenty-fifth switch transistor inputs the third reference level; a gate of the twenty-sixth switch transistor is connected a gate of the thirty-fourth switch transistor, a source of the twenty-sixth switch transistor inputs the first reference level; a gate of the twenty-seventh switch transistor is connected to an output terminal of the pull up controlling module in a second stage gate driving unit, a drain of the twenty-seventh switch transistor inputs the second reference level, a source of the twenty-seventh switch transistor is connected to a drain of the twenty-eighth switch transistor; a gate and a source of the twenty-eighth switch transistor input the first reference level; a gate of the twenty-ninth switch transistor is connected to the output terminal of the pull up controlling module in the second stage gate driving unit, a drain of the twenty-ninth switch transistor is connected to the drain of the twenty-fifth switch transistor, a source of the twenty-ninth switch transistor is a second output terminal of the inverter and is connected to the gate of the eighth switch transistor in the second stage gate driving unit; a gate of the thirtieth switch transistor is connected to the source of the twenty-seventh switch transistor, a source of the thirtieth switch transistor inputs the first reference level, a drain of the thirtieth switch transistor is connected to the source of the twenty-ninth switch transistor; a gate of the thirty-first switch transistor is connected to an output terminal of the pull up controlling module in the third stage gate driving unit, a drain of the thirty-first switch transistor inputs the second reference level, a source of the thirty-first switch transistor is connected to a drain of the thirty-second switch transistor; a gate and a source of the thirty-second switch transistor input the first reference level; a gate of the thirty-third switch transistor is connected to the gate of the thirty-first switch transistor, a drain of the thirty-third switch transistor is connected to the source of the twenty-fifth switch transistor, a source of the thirty-third switch transistor is a third output terminal of the inverter and is connected to the gate of the eighth switch transistor in the third stage gate driving unit; a gate of the thirty-fourth switch transistor is connected to the source of the thirty-first switch transistor, a source of the thirty-fourth switch transistor inputs the first reference level, a drain of the thirty-fourth switch transistor is connected to the source of the thirty-third switch transistor.

\* \* \* \* \*